(12) United States Patent (10) Patent No.: US 8,146,643 B2
Kasahara et al. (45) Date of Patent: Apr. 3, 2012

(54) LAY-UP APPARATUS

(75) Inventors: Masato Kasahara, Okazaki (JP);
Yutaka Momota, Okazaki (JP)

(73) Assignee: Nisshinbo Industries, Inc., Tokyo (JP)

( * ) Notice: Subject to any disclaimer, the term of this patent is extended or adjusted under 35 U.S.C. 154(b) by 397 days.

(21) Appl. No.: 12/361,333

(22) Filed: Jan. 28, 2009

(65) Prior Publication Data

US 2009/0188628 A1 Jul. 30, 2009

(30) Foreign Application Priority Data

Jan. 30, 2008 (JP) ................. 2008-018422

(51) Int. Cl.
*B32B 37/00* (2006.01)
*B32B 37/02* (2006.01)
*B32B 38/00* (2006.01)
*B32B 38/04* (2006.01)

(52) U.S. Cl. ........ 156/517; 156/299; 156/361; 156/510; 156/511; 156/512; 156/516; 156/523; 156/540

(58) Field of Classification Search ................. 156/299, 156/361, 510–512, 516, 517, 523, 540
See application file for complete search history.

(56) References Cited

U.S. PATENT DOCUMENTS

| 4,461,197 | A | * | 7/1984 | Seaman | 83/152 |
| 4,773,944 | A | * | 9/1988 | Nath et al. | 136/249 |
| 6,699,346 | B1 | * | 3/2004 | Nordmann et al. | 156/229 |
| 7,828,031 | B2 | * | 11/2010 | Micciche | 156/517 |

* cited by examiner

*Primary Examiner* — Mark A Osele
*Assistant Examiner* — Christopher C Caillouet
(74) *Attorney, Agent, or Firm* — Westerman, Hattori, Daniels & Adrian, LLP

(57) ABSTRACT

To provide a lay-up apparatus capable of precision positioning and laying of thin strips of copper foil or insulation tape on a flat plane even when there are variations in the cut lengths of the strips. A lay-up apparatus lays first and second strips of tape 101, 102 on top of two electrodes 5, 6 deposited on a photovoltaic devices panel 1. The strips of tape are unwound by first and second grippers 112, 122 and cut to predetermined lengths by first and second cutters 113, 123. The cut strips of tape are laid one on top of the other and transported by rotatable moving means 130. The moving means 130 rotates in opposite directions when laying the strips of tape it holds from the electrode 5 toward the electrode 6 and when laying the strips of tape from the electrode 6 toward the electrode 5, while using one end of the strips of tape as a reference and keeping constant the relative positions of the reference end of the strips of tape and that electrode which is nearest the reference end.

1 Claim, 7 Drawing Sheets

LAY-UP APPARATUS

CLAIM FOR PRIORITY

The present specification claims priority from Japanese Patent Application No. 2008-018422, filed on Jan. 30, 2008 in the Japan Patent Office, the entire contents of which are hereby incorporated by reference herein.

BACKGROUND OF THE INVENTION

1. Field of the Invention

The present invention relates to a technique of laying a thin and band-shaped tape, and particularly to a technique of laying a copper foil and an insulation tape for use in a thin film-type photovoltaic devices.

2. Background Art

There is well known a photovoltaic devices which converts solar energy into electric energy. A crystalline photovoltaic devices is a configuration in which a single-crystalline or poly-crystalline silicon substrate is used. The crystalline photovoltaic cell is a currently dominant but is expensive. On the other hand, a thin film-type photovoltaic devices is formed by depositing thin film-type amorphous silicon on, for example, a glass substrate or the like. There is also a non-silicon thin film-type photovoltaic devices such as CIS. These are all photovoltaic devices.

Usually a thin film-type photovoltaic devices panel is configured with a structure that plural photovoltaic cells are electrically series-connected in one transparent electrode substrate.

FIG. 7 shows a structure of the thin film-type photovoltaic devices panel. A thin film-type photovoltaic devices panel 1 includes plural photovoltaic cells 2 and a peripheral area 3 surrounding the plural photovoltaic cells 2. The plural photovoltaic cells 2 and the peripheral area 3 are insulated each other. Each photovoltaic cell 2 is formed into an elongated rectangular shape along a long side of the photovoltaic devices panel 1, and one of the long sides is an anode and the other is a cathode. Accordingly, the photovoltaic devices panel 1 is configured with the structure that the plural photovoltaic cells 2 are series-connected.

A copper-foil electrode 5 having substantially the same length as the photovoltaic cell 2 is attached to the photovoltaic cell 2 located at the left end of the photovoltaic devices panel 1. A copper-foil electrode 6 having substantially the same length as the photovoltaic cell 2 is attached to the photovoltaic cell 2 located at the right end of the photovoltaic devices panel 1. The plural series-connected photovoltaic cells 2 becomes a direct-current power supply when the electrodes 5 and 6 are connected to a load. In the usage of photovoltaic devices panel 1, the electrodes 5 and 6 are connected to a central junction box 11 via conductors 7 and 8, and the junction box 11 is connected to a connector of load (not shown) to use an electric power generated from the photovoltaic devices panel 1.

The copper-foil conductor 7 extends from the electrode 5 toward the junction box 11, and the conductor 8 extends from the electrode 6 toward the junction box 11. Because the conductors 7 and 8 are conductive materials, a short circuit occurs when the conductors 7 and 8 directly contact the photovoltaic cells 2 located between the electrode 5 and electrode 6. Therefore, insulation tapes 9 and 10 are laid between the conductor 7 and the photovoltaic cells 2 and between the conductor 8 and the photovoltaic cells 2, respectively.

FIG. 8 is an enlarged view of a part of FIG. 7 and shows the relationship A between the electrode 5, the conductor 7, and the insulation tape 9. The relationship A holds true for the relationship B between the electrode 6, the conductor 8, and the insulation tape 10. The relationship B is described by that the electrode 5 can be replaced for the electrode 6, the conductor 7 can be replaced for the conductor 8, and the insulation tape 9 can be replaced for the insulation tape 10 in the description of the relationship A. Therefore the description thereof is omitted in the following description.

When the electrode 5 is placed on the photovoltaic cell 2 located at the left end, the part having a width W of photovoltaic cell 2 at the left end is exposed on one side. The conductor 7 must be connected to the electrode 5, but needs to be electrically insulated from the adjacent photovoltaic cell 2. Therefore, it is necessary that an end 9a of the insulation tape 9 intrude into the part having a width W of photovoltaic cell 2 at the left end, and it is necessary that the relationship of d<W hold, where d is a gap between the end 9a and the electrode 5.

The photovoltaic cell 2 has a width of about 5 to 6 mm. On the other hand, in order to reduce resistances of the electrode 5 and the conductor 7, there is a demand to widen the width of the copper foil used in the electrode 5 and the conductor 7 as much as possible. Frequently, performance of a photovoltaic module is evaluated by its power generation efficiency. The power generation efficiency is efficiency per area, and there is also a demand to reduce a width of an electrode cell that is not used for the power generation. The photovoltaic devices panel 1 has a width of about 1000 mm, and the conductor 7 or the insulation tape 9 has a length of about 400 mm. The accuracy of cutting the conductor 7 or the insulation tape 9 is important to above demands, while only the width W is very narrow, ranging from about 1 to 2 mm. Therefore, the relationship of d<W cannot be secured unless a position at which the conductor 7 or the insulation tape 9 is laid is accurately determined, and the problem above can hardly be solved.

SUMMARY OF THE INVENTION

In view of the foregoing, an object of the invention is to provide a lay-up apparatus with which the tape such as the copper foil and the insulation tape can accurately be positioned and bonded even if a fluctuation in length exists in the cut tape.

To achieve the above-described object, there is provided a lay-up apparatus for laying tape between two strips of material laid on a flat panel separate from but parallel to each other so that the tape extends from each strip of material toward the other strip of material. The lay-up apparatus includes a movable gripper to grip the tape to unwind the tape from a reel around which the tape is wound; a cutter to cut the tape when the gripper unwinds a predetermined length of tape from the reel; and moving means capable of three-dimensional movement while supporting the cut tape. The moving means is rotatable about an axis perpendicular to the flat panel, and is configured to grip and rotate the tape in opposite directions when laying the tape from one of the two parallel strips of material toward the other of the two parallel strips of material and when laying the tape from the other of the two parallel strips of material toward the one of the two parallel strips of material, so as to keep constant relative positions of one end of the tape serving as a reference point and that strip of material of the two parallel strips of material which is nearer the end of the tape serving as a reference point.

The lay-up apparatus may be provided with the moving means which may include a vacuum chuck, and suctionally grip the tape with the vacuum chuck. The lay-up apparatus may be provided with a supporting cradle that is reciprocally vertically movable and configured to suctionally support the cut tape from below when the cutter cuts the tape.

The lay-up apparatus may include a second tape laid parallel to the tape; a second movable gripper to grip the second tape to unwind the second tape from a second reel around which the second tape is wound; and a second cutter to cut the second tape when the second gripper unwinds a predetermined length of the second tape from the second reel, wherein the moving means grips the second tape and the tape while laying the tape below the second tape.

The lay-up apparatus may be configured so that the flat panel is a photovoltaic devices panel in which a thin film of photovoltaic cells is formed on a glass substrate; the strips of material are electrodes provided on the photovoltaic devices panel; the tape is insulation tape; and the second tape is a conductor that connects the electrodes.

According to the lay-up apparatus of the present invention, tape is laid as follows: The lay-up apparatus is provided with tape such as insulation tape and a conductor wound around a reel. The lay-up apparatus includes a movable gripper, and the movable gripper unwinds the tape while gripping an end portion of the tape. When the movable gripper reaches a predetermined position, the tape is cut with a cutter because the tape is unwound to the predetermined length. The cut tape is gripped by the moving means while the tape (conductor) and the insulation tape overlap each other, and the cut tape is then moved near the photovoltaic devices panel 1. The conductor 7 and the insulation tape 9 are transported by the moving means while rotating from point A to A1 around point O in FIG. 6A because the conductor 7 and the insulation tape 9 are orientated as shown in FIG. 7. The conductor 8 and the insulation tape 10 are transported by the moving means while rotating from point A to A2 around point O in FIG. 6A because the conductor 8 and the insulation tape 10 are orientated as shown in FIG. 7. At this point, a rotating direction in bonding the conductor 7 and the insulation tape 9 and a rotating direction in bonding the conductor 8 and the insulation tape 10 are reversed each other.

For example, in the case that the end cut with the cutter is a reference point (end), the position of the moving means is accurately determined, so that the position of the tape gripped by the moving means can be determined such that the end serving as a reference point (end) becomes the end 9a of the insulation tape of FIG. 8. Because the insulation tape 10 is orientated toward the direction opposite to the insulation tape 9, the end position close to the electrode 6 can correctly be determined by reversely rotating the moving means.

When the tape is cut with the cutter, the supporting cradle is provided, and the tape is sucked by the supporting cradle. Therefore, undulation of the tape can be prevented and the tape is supported in the straight state.

Since the moving means sucks the tape with the vacuum chuck, the tape can be moved in the straight state without damaging the tape during transporting.

Other features and advantages of the present invention will be apparent from the following description when taken in conjunction with the accompanying drawings, in which like reference characters designate similar or identical parts throughout the several views thereof.

BRIEF DESCRIPTION OF THE DRAWINGS

FIGS. 4A to 4C show a vacuum chuck with which moving means is provided, in which
FIG. 4A shows a state in which only a second tape is sucked,
FIG. 4B shows a state in which both the tape and the second tape are sucked,
and FIG. 4C shows a lower surface of the vacuum chuck.

DETAILED DESCRIPTION

Figure 7:
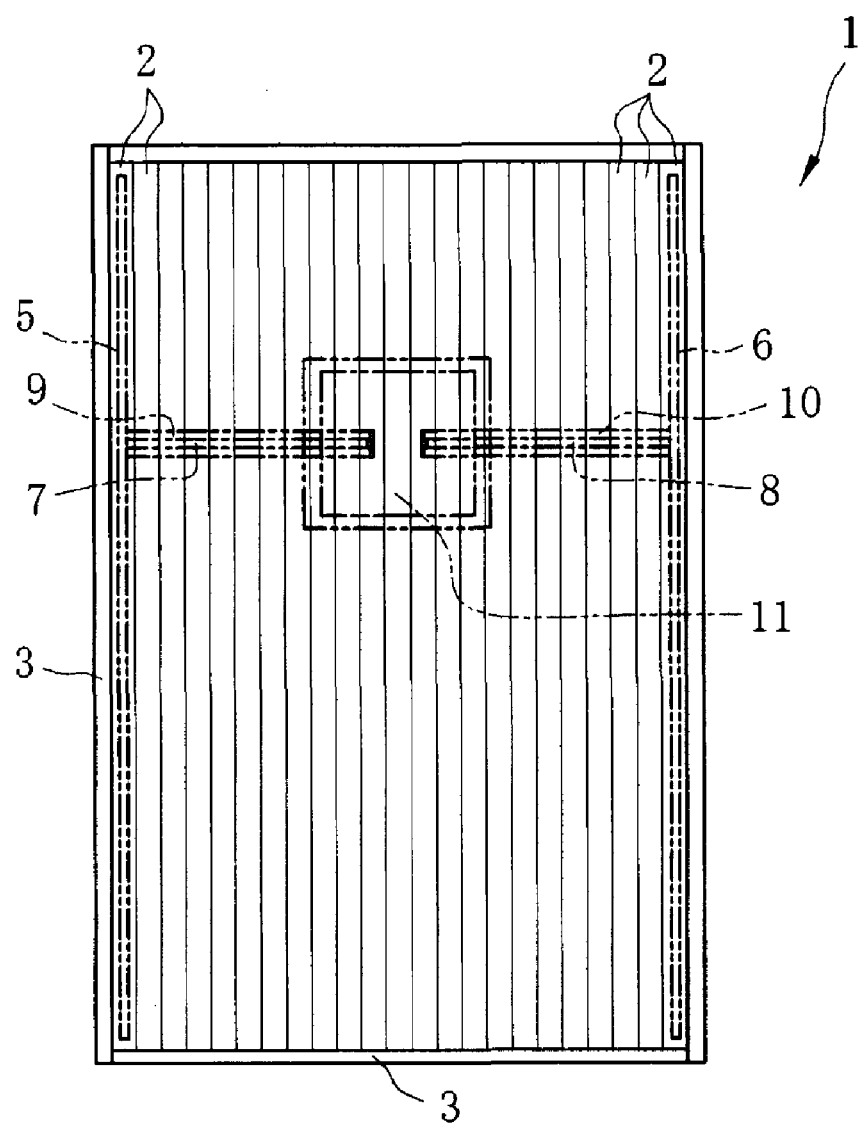
FIG. 7 shows a structure of a thin film-type photovoltaic devices panel.

A description is now given of embodiments of the present invention, with reference to the accompanying drawings. In the following description of embodiments of the present invention, two strips of material are the electrodes 5, 6 of photovoltaic devices panel as shown in FIG. 7. In so doing, specific terminology is employed solely for the sake of clarity, and the present disclosure is not to be limited to the specific terminology so selected. It is to be understood that each specific element includes all technical equivalents that operate in a similar manner and achieve a similar result.

Figure 1:
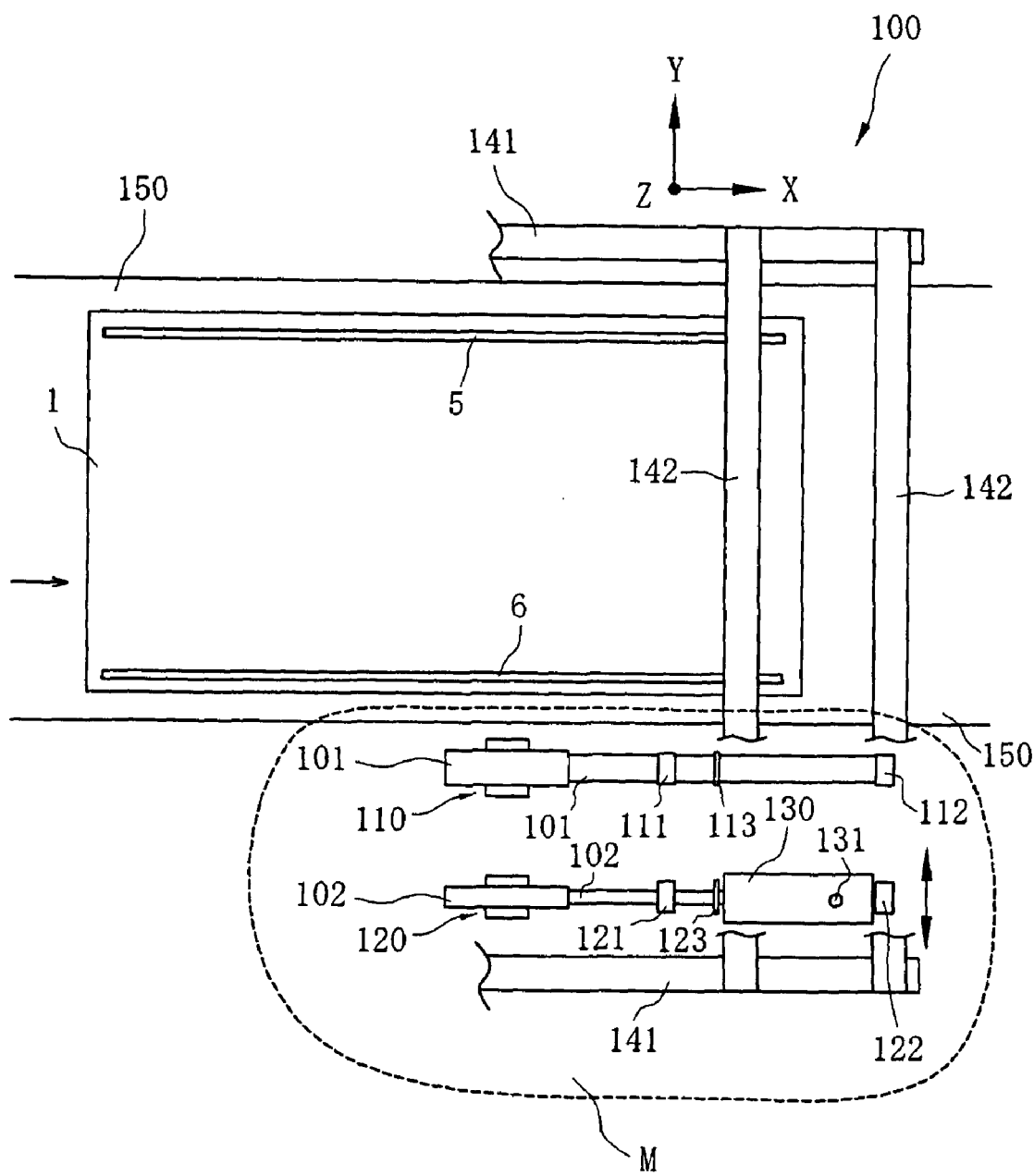
FIG. 1 is a plan view showing a configuration of a lay-up apparatus according to an embodiment of the invention.
Figure 2:
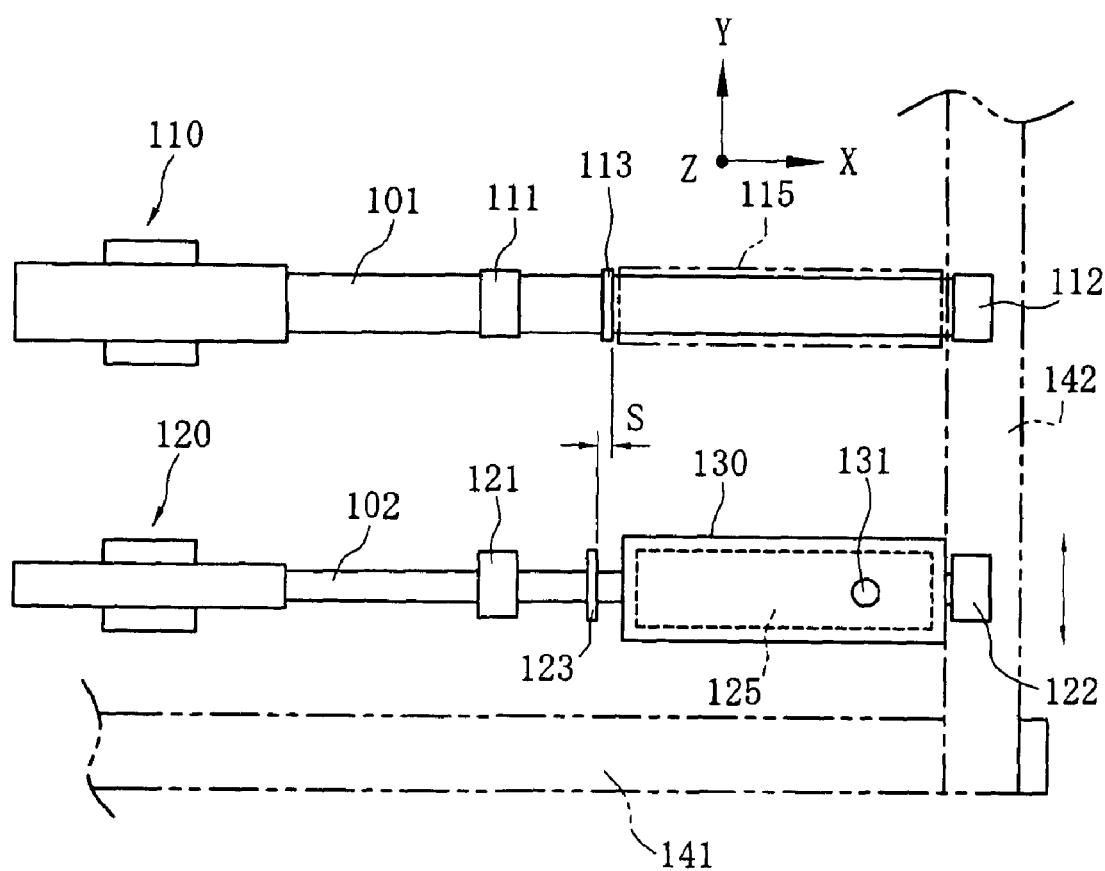
FIG. 2 is an enlarged view showing a main part M of FIG. 1.
Figure 3:
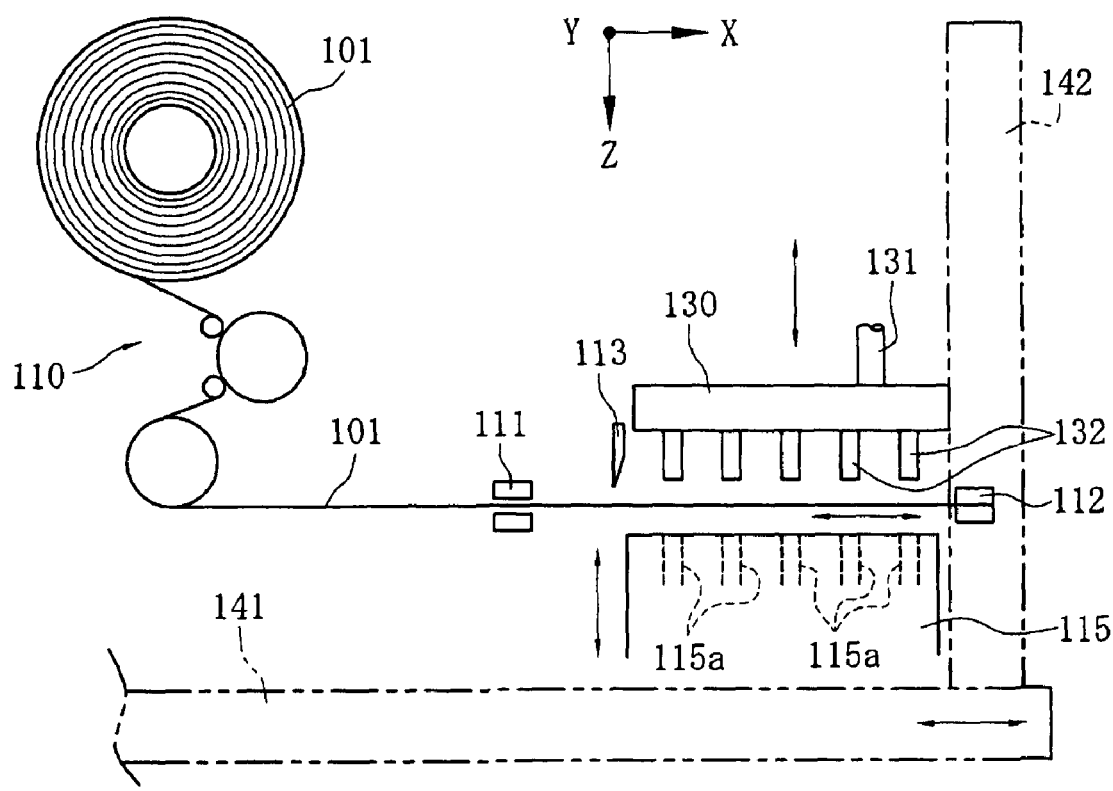
FIG. 3 is a front view of FIG. 2.

FIG. 1 is a plan view showing a configuration of a lay-up apparatus according to an embodiment of the invention. FIG. 2 is an enlarged view showing a main part M of the lay-up apparatus shown in FIG. 1, and FIG. 3 is a front view of the lay-up apparatus shown in FIG. 2.

A lay-up apparatus 100 includes a first reel holder 110 that holds a first strip of tape 101, a second reel holder 120 that holds a second strip of tape 102, a moving means 130, an X-axis rail 141 along which the moving means 130 moves, two Y-axis rails 142 that support the moving means 130 at both ends and move together with the moving means 130, and a conveyer 150 that transports a photovoltaic devices panel 1. The moving means 130 is also capable of moving in the direction of a Z axis that lies orthogonal to the plane of the paper on which the figures are drawn.

The first reel holder 110 holds a reel around which the first strip of tape 101 is wound. In this case, the strip of tape 101 is insulation tape 9, 10. The first reel holder 110 is provided with a first fixed gripper 111, a first movable gripper 112, and a first cutter 113 disposed therebetween. The first fixed gripper 111 is fixed at a predetermined position, and alternately grips and releases the first strip of tape 101.

Around the second reel that the second reel holder 120 holds is wound conductors 7, 8 as the second strip of tape 102. The conductors, 7, 8 are copper foil, that is, a thin strip of copper. The second reel holder 120 is also provided with a second fixed gripper 121, a second movable gripper 122, and a second cutter 123 disposed therebetween.

In the configuration described above, overall control of the apparatus, including control of the moving means 130 and the movable grippers as well as control of the cutters and so forth, is carried out by numerical control using a computer that is not shown in any of the drawings.

Next, a description is given of the laying of the strips of tape by the lay-up apparatus according to an embodiment of the present invention.

A photovoltaic devices panel 1 is placed on the conveyer 150, transported from the left in FIG. 1, and stopped at a predetermined position shown in the drawing. Electrodes 5, 6 are attached to the photovoltaic devices panel 1 in a preceding manufacturing step. The same copper foil that is used for the conductors 7, 8 is also used for the electrodes 5, 6. Although the electrodes 5, 6 are fixed on the photovoltaic cells 2 of the photovoltaic devices panel 1, they are not permanently fixed in place but instead are only provisionally fixed in place as described below.

Prior to attaching the copper foil to the photovoltaic devices panel 1 as electrodes 5, 6, discrete drops of liquid conductive adhesive are applied at points where the electrodes 5, 6, are to be placed on the thin film-type photovoltaic cells 2. The copper foil electrodes 5, 6 are then set on these points of liquid conductive adhesive and short strips of adhesive tape are then applied to the electrodes 5, 6 at a plurality of points from above in a direction that intersects the electrodes 5, 6 to provisionally fix the electrodes 5, 6 in place and keep them from moving. As the adhesive hardens, between the adhesive force of the adhesive and the adhesive force of the adhesive tape the electrodes 5, 6 can be provisionally fixed in place.

When the photovoltaic devices panel 1 with the electrodes 5, 6 provisionally fixed in place as described above arrives at the predetermined position shown in FIG. 1, the first movable gripper 112 moves toward the reel of the first strip of tape 101 at the left in FIG. 1, grips the ends of the first strip of tape 101, and moves to the right in FIG. 1 to unwind a predetermined length of the first strip of tape 101 from the reel.

Because the position along the X axis of the first movable gripper 112 is grasped with precision by numerical control, the length of first strip of tape 101 unwound from the reel can be determined with precision. When the first movable gripper 112 comes to a stop at the predetermined position, the first fixed gripper 111 clamps the first strip of tape 101 from above and below and holds it. Then, the first cutter 113 descends and cuts the first strip of tape 101 to a desired length. However, variations (tolerances) do appear in the length of the first strip of tape 101 depending on how much of the first strip of tape 101 the first movable gripper 112 grips.

A first cradle 115 that is capable of reciprocal vertical movement is provided beneath the first cutter 113 and the first movable gripper 112. The first cradle 115 is provided with multiple vacuum holes 115a in order to suctionally attract and vacuum-attach the first strip of tape 101 to the first cradle 115. Although the cut first strip of tape 101 has a tendency to curl because it has just been unwound from the reel, it is set on top of the ascending first cradle 115 and sucked onto the top surface of the first cradle 115 by the vacuum force exerted through the vacuum holes 115a, removing the curl and enabling the first strip of tape 101 to be held straight.

Next, the second movable gripper 122 moves toward the reel holding the second strip of tape 102, grips the end of the second strip of tape 102, and moves to the right in FIG. 1 to unwind a predetermined length of the second strip of tape 102 from the reel.

Because the position of the second movable gripper 122 also is grasped with precision by numerical control, the length of second strip of tape 102 unwound from the reel can be determined with precision. When the second movable gripper 122 comes to a stop at a predetermined position, the second fixed gripper 121 clamps the second strip of tape 102 from above and below and holds it. Then, the second cutter 123 descends and cuts the second strip of tape 102 at a desired length. In the present embodiment, the length of the second strip of tape 102 is set to be slightly longer than the length of the first strip of tape 101. However, variations (tolerances) do appear in the length of the second strip of tape 102 depending on how much of the second strip of tape 102 the second movable gripper 122 grips.

A second cradle 125 identical in structure to the first cradle 115 is provided beneath the second cutter 123 and the second movable gripper 122. When the second strip of tape 102 is cut, the second cradle ascends and the second strip of tape 102 is vacuum-attached to the top of the second cradle 125.

Next, a description is given of a method of supporting the first strip of tape 101 vacuum-attached and held to the first cradle 115 and the second strip of tape 102 vacuum-attached and held to the second cradle 125 by the moving means 130.

Figure 4A:
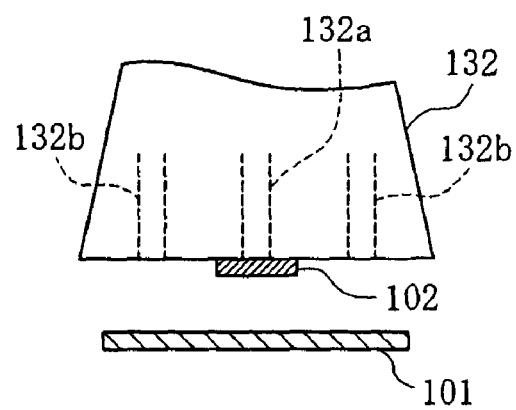
Figure 4B:
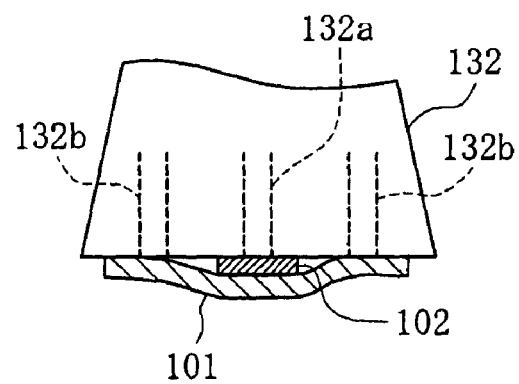
Figure 4C:
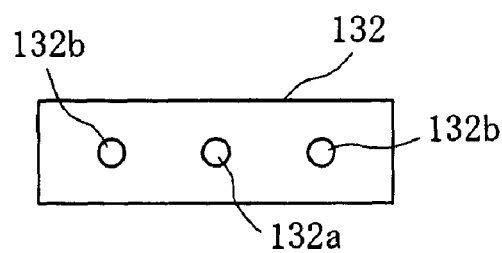

FIGS. 4A to 4C show one of a plurality of vacuum chucks 132 with which the moving means 130 is provided, in which FIG. 4A shows a state in which only the second strip of tape 102 is vacuum-attached, FIG. 4B shows a state in which both the first strip of tape 101 and the second strip of tape 102 are vacuum-attached, and FIG. 4C shows a bottom surface of the vacuum chuck 132.

As is shown in FIGS. 4A to 4C, a vacuum hole 132a is provided in the center of the vacuum chuck 132 and two more vacuum holes 132b are provided on either side of the vacuum hole 132a in the center. The vacuum hole 132a in the center and the vacuum holes 132b on both sides are configured so as to be capable of independent control, that is, starting suction and stopping suction independently.

When the moving means 130 moves horizontally to a position above the second cradle 125 and descends onto the second strip of tape 102, the vacuum hole 132a in the center of each one of all the plurality of vacuum chucks starts suction to create a vacuum that causes the second strip of tape 102 on top of the second cradle 125 to become vacuum-attached to the moving means 130. When the suction of the second cradle 125 is stopped, the second strip of tape 102 is gripped solely by the moving means 130 as shown in FIG. 4A. The moving means 130 gripping the second strip of tape 102 ascends along the Z axis and then moves horizontally to a position above the first cradle 115, where it descends onto the first strip of tape 101. Then, when the plurality of vacuum holes 132b on the sides of the bottom surfaces of each one of the plurality of vacuum chucks 132 starts suction, the first strip of tape 101 on the first cradle 115 is vacuum-attached to the moving means 130. At this time, because the second strip of tape 102 is vacuum-attached by the vacuum holes 132a in the center, the two strips of tape 101 and 102 are vacuum-attached in such a way that the first strip of tape 101 overlays the second strip of tape 102 as shown in FIG. 4B. When the suction of the first cradle 115 is stopped, the two strips of tape 101 and 102 are gripped solely by the moving means 130 in the overlapping, overlaid state shown in FIG. 4B.

Figure 5:
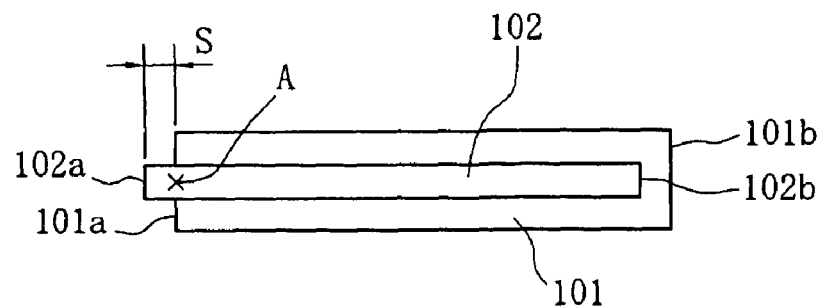
FIG. 5 shows the tape and second tape that are gripped by the moving means.

FIG. 5 shows a lateral view of the first strip of tape 101 and the second strip of tape 102 gripped by the moving means 130. The cut end of the first strip of tape 101 cut by the first cutter 113 is 101a, and the end gripped by the first movable gripper 112 is 101b. Similarly, the cut end of the second strip of tape 102 cut by the second cutter 123 is 102a, and the end gripped by the second movable gripper 122 is 102b. When the first strip of tape 101 and the second strip of tape 102 are overlaid, such that the first strip of tape 101 covers the second strip of tape 102 which lies between the first strip of tape 101 and the vacuum chucks on the bottom of the moving means 130, the second cut end 102a projects beyond the first cut end 101a by a length S. By contrast, on the side of the first gripped end 101b and the second gripped end 102b, errors in length appear. By vacuum-attaching the two strips of tape and laying them atop a flat plane in the manner described above, errors in cutting the first strip of tape 101 and the second strip of tape 102 can be concentrated at the junction box 11 side as shown in FIG. 7. The way in which the difference S described above is set is not limited to any particular method, and can, for example, be set by offsetting the positions of the first cutter 113 and the second cutter 123 along the X axis.

Figure 8:
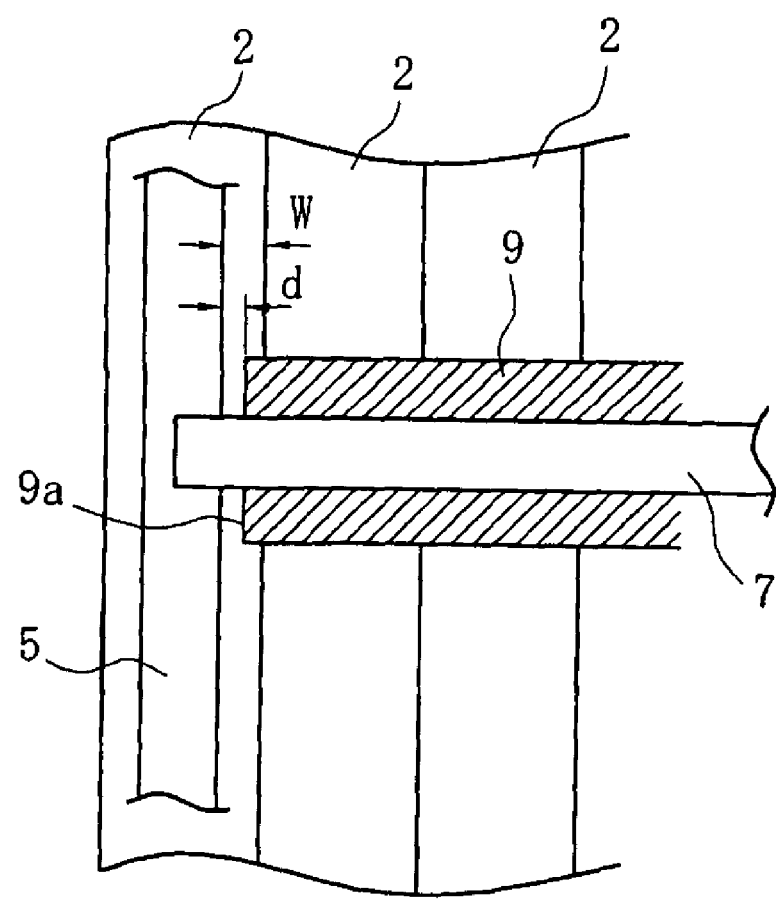
FIG. 8 is an enlarged view showing a part of FIG. 7.

By providing the difference S as described above, the conductor 7 and the electrode 5 can be overlaid and at the same time the insulation tape 9 can be separated from the electrode 5 by the distance d as shown in FIG. 8.

Figure 6A:
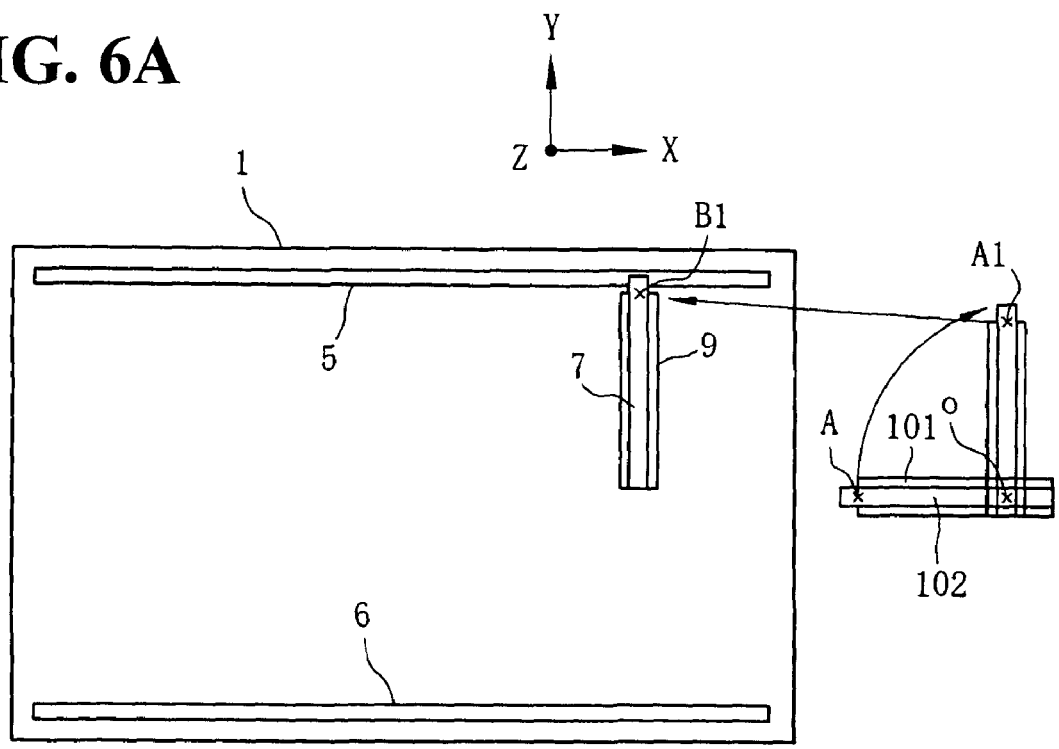
FIG. 6A illustrates a situation in which the first and second tape correspond to insulation tape 9 and conductor 10 respectively.
Figure 6B:
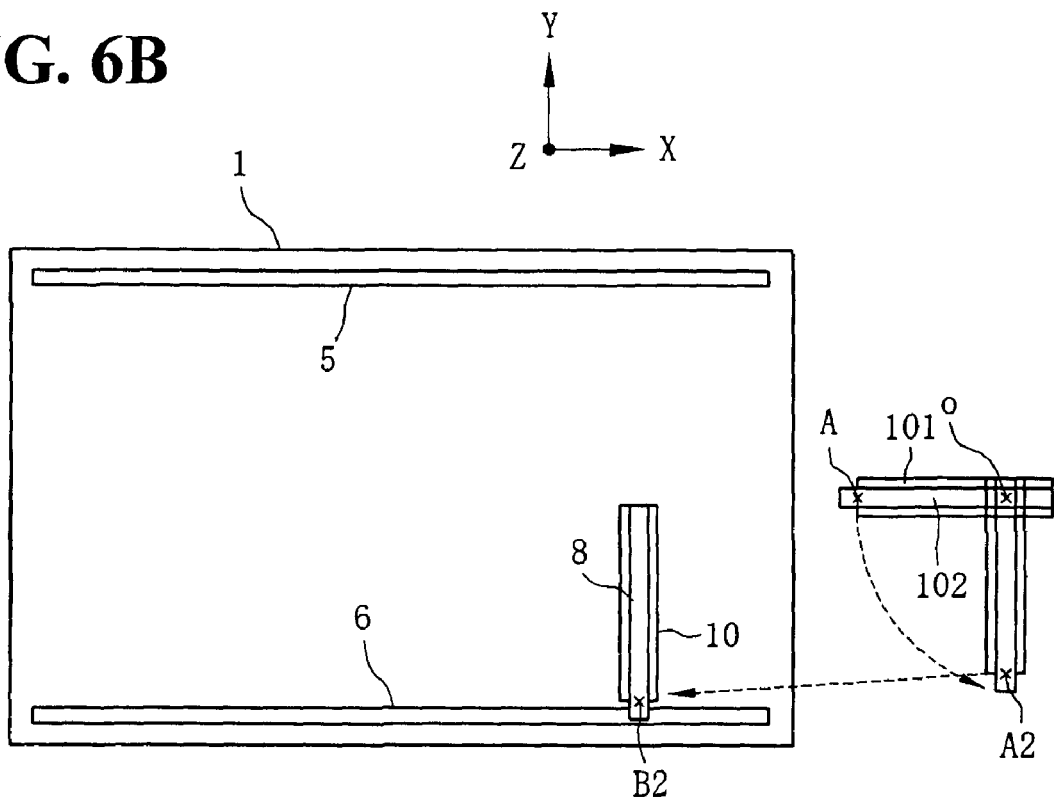
FIG. 6B illustrates a situation in which the above two tapes correspond to insulation tape 10 and conductor 8 respectively.

FIGS. 6A and 6B illustrate how the first strip of tape and the second strip of tape 102 gripped by the moving means are moved over the photovoltaic devices panel 1. FIG. 6A shows a situation in which the first strip of tape 101 and the second strip of tape 102 correspond to the insulation tape 9 and the conductor 7, respectively, while FIG. 6B illustrates a situation in which the first strip of tape 101 and the second strip of tape 102 correspond to the insulation tape 10 and the conductor 8, respectively. The moving means 130 ascends along the Z axis while gripping the first strip of tape 101 and the second strip of tape 102 in a state in which the first strip of tape 101 overlays the second strip of tape 102, moves within an X-Y plane (horizontal plane), and places a center O of a rotary axis 131 of the moving means 130 at a predetermined particular set of coordinates within the X-Y plane. At this time, the relative positions of a central point A of the end 101a and the center O of the rotary axis 131 remain constant. Since the coordinates of the center O are known, it is possible to obtain by calculation the coordinates of point A.

Next, in order to make the overlapping first strip of tape and second strip of tape 102 match the direction of the conductors 7 and 8, the moving means 130 is rotated about the center O of the rotary axis 131. At this time, when laying the overlapping first strip of tape 101 and second strip of tape as the insulation tape 9 and the conductor 7, the moving means is rotated clockwise as shown by the solid line in FIG. 6A. The position of point A after the moving means 130 is rotated in the direction of the solid line moves to A1. When laying the overlapping first strip of tape 101 and second strip of tape 102 as the insulation tape 10 and the conductor 8, the moving means 130 is rotated counterclockwise as shown by the dotted line in FIG. 6B. The position of point A after the moving means 130 is rotated in the direction of the dotted line moves to A2. Although in the present embodiment both angles of rotation are 90 degrees, it is to be noted that the angles of rotation are not limited to 90 degrees.

The distance between point O and point A is known, as is the angle of rotation, and therefore it is possible to calculate the coordinates of points A1 and A2. Then, by moving the moving means 130 so that points A1 and A2 coincide with points B1 and B2, respectively, the lay-up positions of the first strip of tape 101 and the second strip of tape 102 can be determined precisely.

In the embodiment described above, so that d<W the point A which serves as a reference point is positioned at the center of the end of the first strip of tape 101. Alternatively, however, if it is a requirement that the electrodes 5, 6 and the second strip of tape 100 overlap, then the reference point A may be set at another point, such as the center of the end of the second strip of tape 102. In addition, the first strip of tape 101 and the second strip of tape 102 may be laid separately on the photovoltaic devices panel 1 one strip at a time, in which case the reference point A is set on each of the first strip of tape 101 and the second strip of tape 102, respectively. By laying the tape in this way, the relative positions of the electrodes 5, 6 and the first and second strips of tape 101, 102 can be kept constant.

When the conductors 7, 8 and the insulation tape 9, 10 are placed on the photovoltaic devices panel 1 as described above, although not shown in the drawings the conductors 7, 8 and the insulation tape 9, 10 are provisionally fixed in place at multiple locations with adhesive tape and the conductors 7, 8 are bent at right angles at appropriate positions on the junction box side to stand them up.

Applying in advance the adhesive used when provisionally fixing the electrodes 5, 6 in place as described above indiscrete drops at the positions where the insulation tape 9, 10 is set on the photovoltaic devices panel 1 greatly increases the fixing strength of the provisional fix.

Once the electrodes 5, 6, the conductors 7, 8, and the insulation tape 9, 10 are provisionally fixed in place as described above, an EVA sheet is laid over them from above, and further, a backing sheet is laid over the EVA sheet, after which the whole assembly is heated and pressed using a known laminator apparatus to complete the photovoltaic devices panel 1.

In the embodiment described above, a description is given of an instance in which the first strip of tape 101 and the second strip of tape 102 are overlaid one on top of the other on the photovoltaic devices panel 1. However, the same method can be applied when the first strip of tape 101 and the second strip of tape 102 are laid up separately.

As many apparently widely different embodiments of the present invention can be made without departing from scope thereof, it is to be understood that the invention is not limited to the specific embodiments thereof except as defined in the appended claims.

What is claimed is:

1. A lay-up apparatus for laying tape between two strips of material laid on a flat panel separate from but parallel to each other so that the tape extends from each strip of material toward the other strip of material, the lay-up apparatus comprising:
a movable gripper to grip the tape to unwind the tape from a reel around which the tape is wound;
a cutter to cut the tape when the gripper unwinds a predetermined length of tape from the reel;
a second tape laid parallel to the tape;
a second movable gripper to grip the second tape to unwind the second tape from a second reel around which the second tape is wound;
a second cutter to cut the second tape when the second gripper unwinds a predetermined length of the second tape from the second reel; and
a moving means capable of three-dimensional movement while supporting the cut tape,
the moving means being rotatable about an axis perpendicular to the flat panel, and configured to grip and rotate the tape in opposite directions when laying the tape from one of the two parallel strips of material toward the other of the two parallel strips of material and when laying the tape from the other of the two parallel strips of material toward the one of the two parallel strips of material, so as to keep constant relative positions of one end of the tape serving as a reference point and that strip of material of the two parallel strips of material which is nearer the end of the tape serving as a reference point, wherein
the moving means grips the second tape and the tape while laying the tape below the second tape.

* * * * *